(12) United States Patent
Nguyen

(10) Patent No.: US 7,656,219 B2
(45) Date of Patent: Feb. 2, 2010

(54) UNITY GAIN VOLTAGE BUFFER WITH DUAL SUPPLY VOLTAGE FOR MANAGING CURRENT CONSUMPTION IN LOW VOLTAGE APPLICATIONS

(75) Inventor: Victor Nguyen, Fremont, CA (US)

(73) Assignee: Atmel Corporation, San Jose, CA (US)

( * ) Notice: Subject to any disclaimer, the term of this patent is extended or adjusted under 35 U.S.C. 154(b) by 189 days.

(21) Appl. No.: 11/627,695

(22) Filed: Jan. 26, 2007

(65) Prior Publication Data

US 2008/0179954 A1   Jul. 31, 2008

(51) Int. Cl.
  *H03F 3/45* (2006.01)
(52) U.S. Cl. .................. 327/363; 327/73; 327/543; 330/260; 307/44; 307/87
(58) Field of Classification Search ............ None
  See application file for complete search history.

(56) References Cited

U.S. PATENT DOCUMENTS 6,094,093 A * 7/2000 Karanicolas ............ 327/560
6,282,038 B1 * 8/2001 Bonaccio et al. ........... 360/46
6,518,817 B2   2/2003 Anderson et al.
6,897,717 B1 * 5/2005 Eddleman et al. ......... 327/543

* cited by examiner

*Primary Examiner*—Lincoln Donovan
*Assistant Examiner*—Terry L Englund
(74) *Attorney, Agent, or Firm*—Schwegman, Lundberg & Woessner, P.A.

(57) ABSTRACT

A circuit and method for producing an output voltage that replicates an input voltage. A circuit comprises an amplifier stage configured to amplify a difference between an input voltage and a feedback voltage. An output stage is configured to produce an output voltage equal to the input voltage. The output stage configured to be driven by the difference between the input voltage and the feedback voltage. The output stage further comprises a main supply current path configured to provide a first current from a main supply source, the first current providing at least a portion of the output voltage, and a current management circuit configured to provide a second current from an auxiliary supply source, the second current providing any remaining portion of the output voltage not provided by the first current.

22 Claims, 4 Drawing Sheets

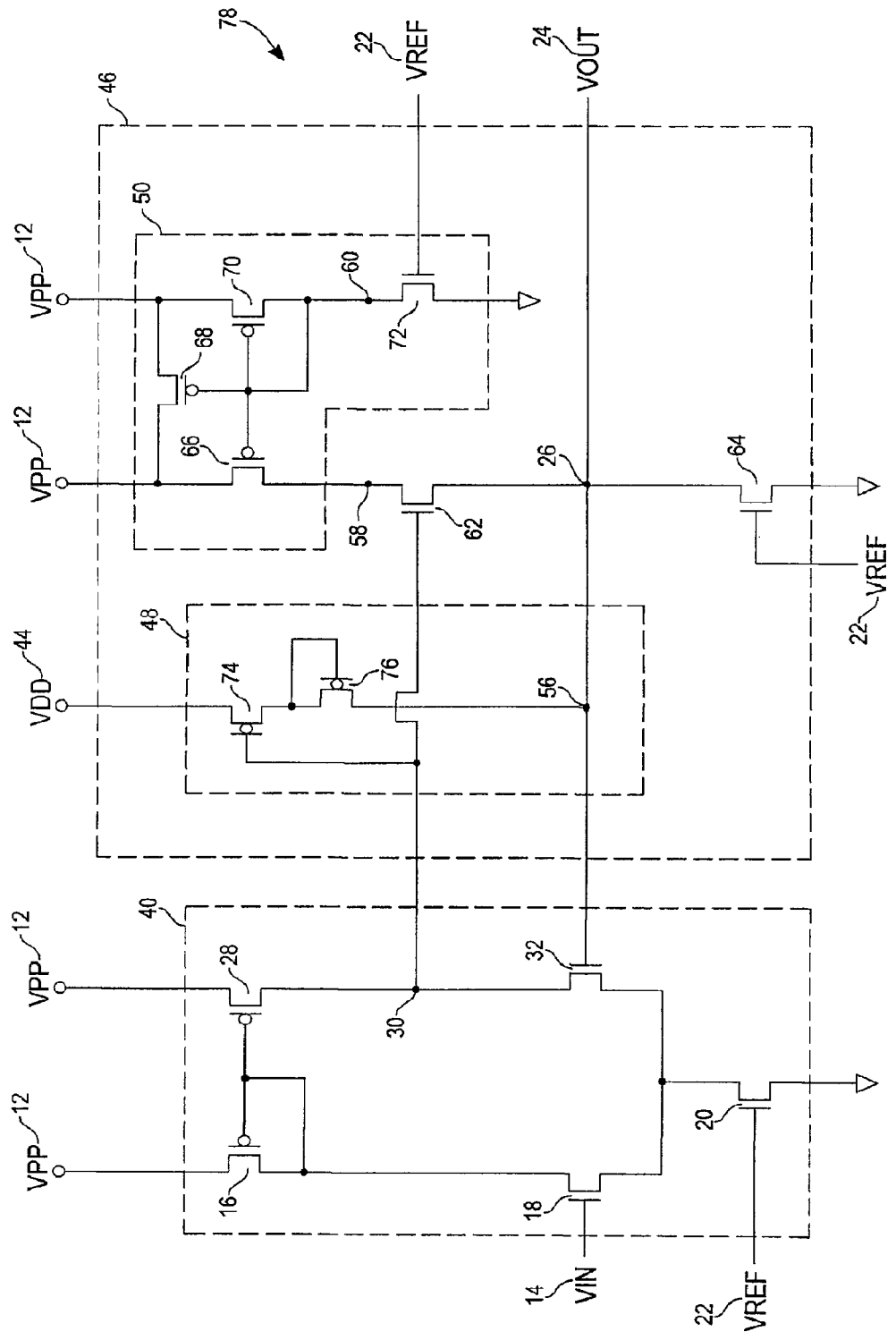
Fig._4

UNITY GAIN VOLTAGE BUFFER WITH DUAL SUPPLY VOLTAGE FOR MANAGING CURRENT CONSUMPTION IN LOW VOLTAGE APPLICATIONS

TECHNICAL FIELD

This invention is concerned with a circuit whose output voltage is a replica of its input voltage.

BACKGROUND

Unity gain voltage buffers may be used to transfer voltage from a first circuit to a second circuit without the second circuit unacceptably loading the first circuit and interfering with the operation of the first circuit. In these circuits, the output voltage is an exact replica of the input voltage. A prior art unity gain voltage buffer circuit 10 is shown in FIG. 1. The input voltage VIN 14 and output voltage VOUT 24 are compared at the differential amplifier stage 40. The difference between these voltages is amplified and drives the output stage 42, which produces output voltage VOUT 24, which is a replica of VIN 14. Current for providing VOUT 24 is supplied to the output stage 42 by a secondary supply voltage 12.

The circuit 10 is shown in greater detail in FIG. 2. Transistors 16, 18, 28, 32, and 20 all form the differential amplifier stage comparing VIN 14 and VOUT 24 (a feedback voltage). The difference is amplified and presented at node 30, which drives the output stage 42 of the circuit 10. The output stage 42 consists of transistors 34 (the gate of which is coupled to node 30) and 36.

Five voltage sources are available to these types of circuits. There are the two major supply voltages common in all basic circuit: the main supply voltage VDD, which generally ranges from 2 to 4 V; and ground voltage, which is 0 V. A third voltage source is an auxiliary or secondary supply voltage VPP, which is produced by a positive charge pump that produces a voltage range of 4.5 V to 5.5 V (though other voltage ranges may be produced in other examples) with limited maximum output current. The limited output current is directly related to the amount of layout area on a chip which is allotted to the charge pump producing VPP. In addition, the output current is also limited due to the total active power consumption specification of the entire chip because the maximum output current is a percentage of the current the charge pump draws from VDD. The auxiliary supply voltage is also used in may other critical areas of the chip. The fourth voltage source is a reference voltage VREF, which allows for regulation of current flow in an analog circuit. The fifth and final voltage source is input voltage VIN, which in this example ranges from 1 V to 3 V. The input voltage cannot have a current load if it is to maintain its correct value.

The output voltage which replicates the input voltage ideally should be able to manage a large current load. This output voltage has a default state of 0 V. Returning to FIG. 2, since the value of VIN 14 can be higher than VDD, the secondary supply voltage VPP 12 is used to supply both the differential amplifier stage 40 and the output stage 24. However, this configuration results in a disadvantageous current load on VPP 12. Since there is a limited maximum output current for VPP 12, a larger output current requirement for VOUT 24 will drop VPP 12 in voltage and cause this circuit 10 and the other blocks using VPP to malfunction.

One potential solution to this problem is to increase the current output capability of VPP. This would result in a much larger charge pump which would take up more area on the chip. However, the active current specifications of the chip limit the size of the charge pump.

Therefore, it would be advantageous to provide a circuit that outputs a replica of its input voltage with increased current drive regardless of whether the input voltage is greater than the main supply voltage or if the main supply voltage or input voltage varies significantly.

SUMMARY OF THE INVENTION

In an exemplary embodiment of the invention, a circuit comprises an amplifier stage configured to amplify a difference between an input voltage and a feedback voltage. An output stage is configured to produce an output voltage equal to the input voltage. The output stage configured to be driven by the difference between the input voltage and the feedback voltage. The output stage further comprises a main supply current path configured to provide a first current from a main supply source, the first current providing at least a portion of the output voltage, and a current management circuit configured to provide a second current from an auxiliary supply source, the second current providing any remaining portion of the output voltage not provided by the first current.

In another exemplary embodiment of the invention, a method for producing an output voltage replicating an input voltage comprises amplifying a difference between the input voltage and a feedback voltage. A first current from a main supply source is provided, the first current providing at least a portion of the output voltage. A second current is provided from an auxiliary supply source, the second current providing any remaining portion of the output voltage not provided by the first current. The provision of the first and second currents is driven by the difference between the input voltage and the feedback voltage.

In yet another exemplary embodiment of the invention, a circuit comprises an amplifier stage configured to amplify a difference between an input voltage and a feedback voltage. An output stage is configured to produce an output voltage equal to the input voltage, the output stage configured to be driven by the difference between the input voltage and the feedback voltage. The output stage further comprises a current path configured to provide a first current from a main supply source, the first current supply at least a portion of the output voltage, and a current management circuit configured to provide a specified maximum current from an auxiliary supply source, the specified maximum current providing any remaining portion of the output voltage not provided by the current path.

BRIEF DESCRIPTION OF THE DRAWINGS

FIG. 4 is a circuit diagram of an exemplary embodiment of a unity gain voltage buffer circuit of the present invention.

DETAILED DESCRIPTION

Figure 1:
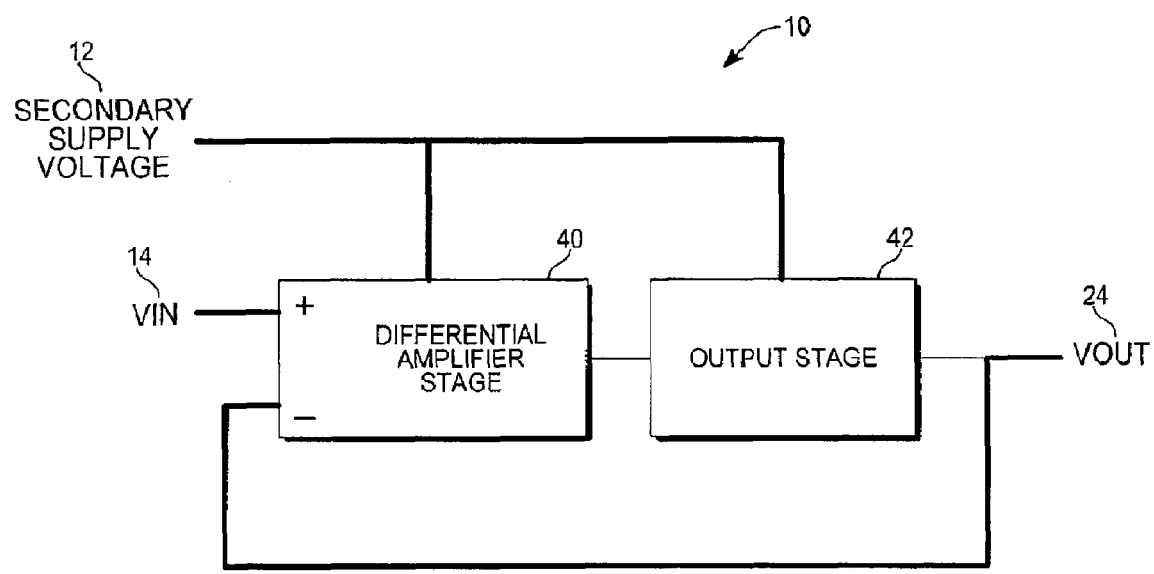
FIG. 1 is a block diagram of a prior art unity gain voltage buffer circuit.
Figure 2:
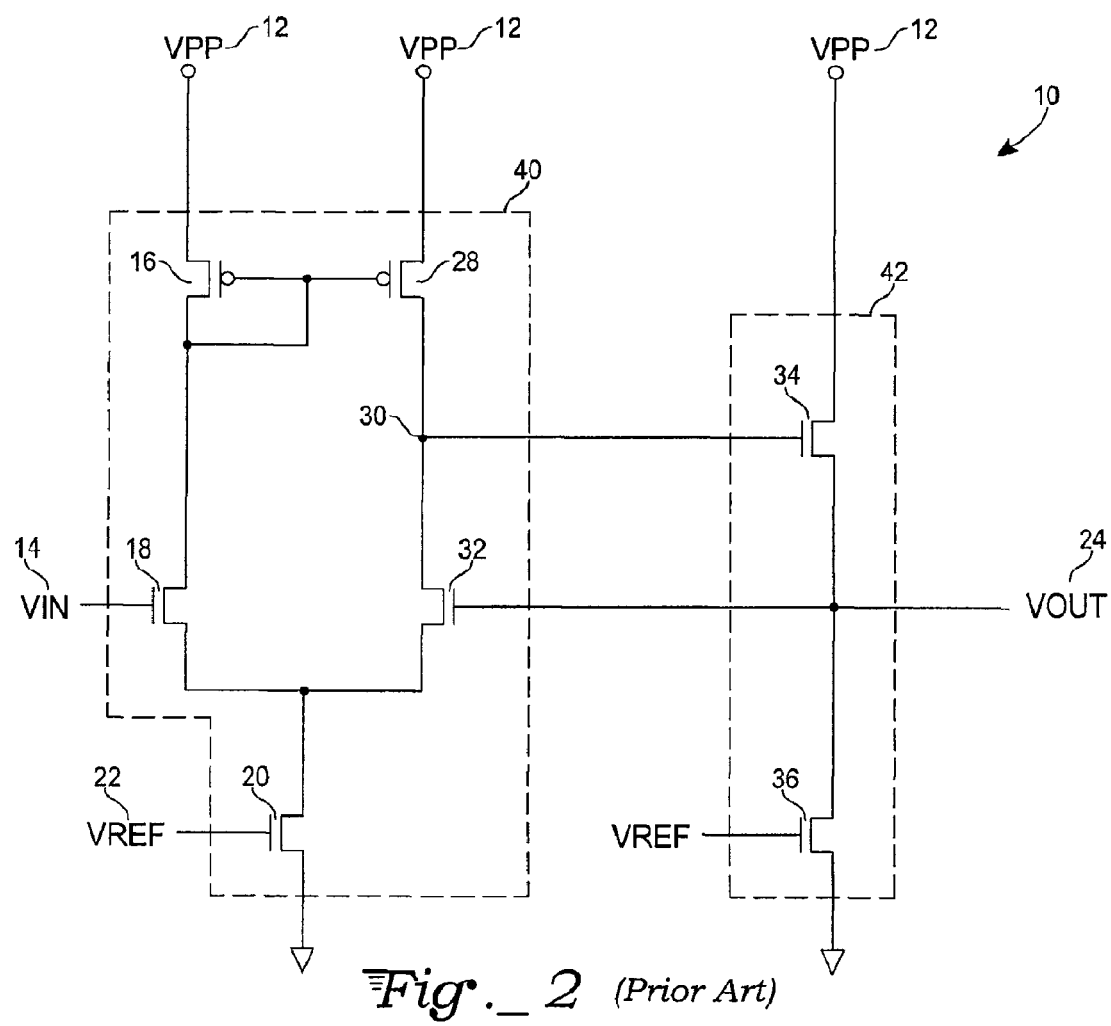
FIG. 2 is a circuit diagram of a prior art unity gain voltage buffer circuit.
Figure 3:
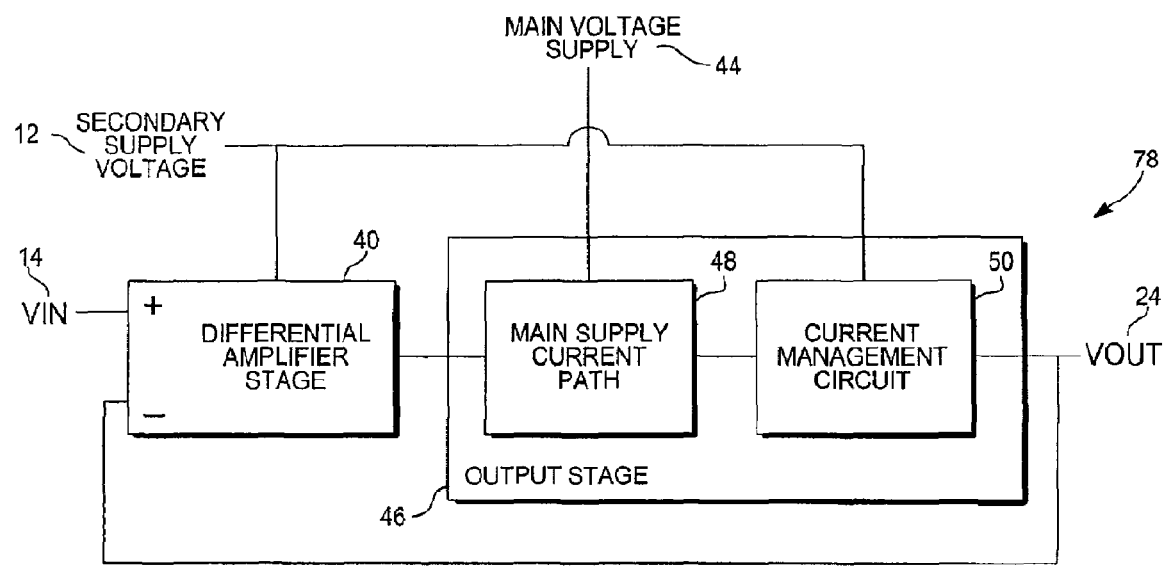
FIG. 3 is a block diagram of an exemplary embodiment of a unity gain voltage buffer circuit of the present invention.

An exemplary embodiment of a unity gain voltage buffer circuit 78 is shown in FIG. 3. The input voltage 14 and feedback output voltage 24 are compared at differential amplifier stage 40. The difference between the voltages drives the output stage 46, which includes a main supply current path 48, supplied by the main voltage supply 44 and a current management circuit 50 and is supplied by the secondary supply voltage 12. The output voltage 24 replicating the input voltage 14 is provided by both the main voltage supply 44 and, as discussed in greater detail below, the secondary voltage supply 12. The output voltage 24 has a higher current output capability than the input voltage 14.

A circuit diagram of an exemplary embodiment of a unity gain voltage buffer circuit 78 is shown in FIG. 4. The differential amplifier stage 40 is supplied by secondary or auxiliary supply voltage VPP 12. Transistors 16, 18, 20, 28, and 32 form a differential amplifier stage which is well known to those of skill in the art. The differential amplifier stage 40 compares the difference between input voltage 14 and the feedback output voltage 24. In this embodiment, transistors 16 and 28 are PMOS transistors and transistors 18, 20, and 32 are NMOS transistors. VREF 22 is coupled to the gate of transistor 20. VPP 12 is coupled to the source of transistor 16 and transistor 28. The gates of transistors 16 and 28 are coupled to each other. The difference between VIN 14 and VOUT 24 is amplified and presented at node 30. This difference drives output stage 46.

The output stage includes a main supply current path 48 and a current management circuit 50. The main supply voltage VDD 44 supplies current to the main supply current path 48 while the auxiliary supply voltage VPP 12 supplies current to the current management circuit 50. The main supply current path 48 and current management circuit 50 provide current which provides the output voltage 24 which replicates the input voltage 14. The output stage 46 also includes transistor 62 and transistor 64. The gate of transistor 62 is coupled to node 30 of the differential amplifier stage 40. The gate of transistor 64 is coupled to reference voltage VREF 22.

In an exemplary embodiment, the main supply current path 48 includes two transistors 74 and 76. These transistors are native devices with 0 V threshold voltage (Vt). Transistor 76 is in a diode configuration. Therefore, a very low voltage, 2*Vt, is required to open a path from VDD 44 to VOUT at node 56. The gate of transistor 74 is coupled to node 30 of the differential amplifier stage 40. The difference between the input voltage 14 and feedback output voltage 24, as presented at node 30, turns on transistor 74. The maximum voltage provided by transistors 74 and 76 onto VOUT at node 56 is VDD−Vt. If an output voltage 24 greater than the main supply voltage 44 is required, the auxiliary supply voltage 12 is needed.

As noted above, current management circuit 50 is supplied by the auxiliary supply voltage 12. Current management circuit 50 includes transistors 66, 68, 70, and 72. In this embodiment, transistors 66, 68, and 70 are PMOS transistors while transistor 72 is an NMOS transistor. The gate of transistor 72 is coupled to VREF 22 which provides the current reference for the current management circuit 50. The sources of transistors 66 and 70 are coupled to VPP 12. The source and drain of transistor 68 are each coupled to VPP 12.

Current management circuit 50 allows only a specified maximum current through node 58. Transistors 70 and 66 mirror onto node 58 any desired multiplicative factor of the current through node 60. This factor depends on the size ratio between transistors 66 and 70. Transistor 68 acts as a capacitor to create a sloped profile for the allowed current through node 58 and to minimize the effect of adding a current load on VPP 12. (In other embodiments, any other device which acts as a capacitor, including a capacitor, may be used.) The size of the transistor 68 can be modified to produce the desired slope for the allowed current. The transistor 68 acting as a capacitor is a timing element in the current management circuit 50 because it directly affects the overall capacitive value of node 60 which must be discharged enough to turn on PMOS transistor 66 to open a current path from VPP 12 to node 58.

The allowed current through node 58 provides at node 26 the remaining voltage not provided by the main supply current path 48 necessary for VOUT 24 to replicate VIN 14. However, this allowed current is controlled and does not cause a drop in VPP 12 that will cause either this circuit or other blocks on the chip relying on VPP to malfunction.

The output voltage 24 produced by the unity gain voltage buffer circuit 78 replicates the input voltage 14 but has an increased current drive. The circuit 78 can also produce an output voltage 24 that replicates the input voltage 14 even if the input voltage 14 is greater than the main supply voltage 44. Current is drawn from the auxiliary supply source 12 only when necessary. Since VOUT is ramped from 0 V (the default voltage) to the target voltage, there is a range of voltages in which VDD can be used to provide VOUT. This circuit 78 can produce a consistent output voltage 24 even if the main supply voltage 44 or input voltage 14 varies significantly.

In one example, VIN is 1 V, VDD is 2.5 V, VPP is 5 V, and VOUT is 1 V. In this case, the circuit draws the majority of current necessary to provide 1 V (VOUT) from VDD. Very little or almost no current is drawn from VPP.

In a second example, VIN is 2 V, VDD is 2.5 V, VPP is 5 V, and VOUT is 2 V. Here, the circuit draws the majority of current necessary to provide 2 V (VOUT) from VDD. Depending on the sizes of the capacitor in the current management circuit, the current drawn from VPP can be minimized.

In a third example, VIN is 3 V, VDD is 2.5 V, VPP is 5 V, and VOUT is 3 V. In this example, the circuit draws a large amount of current from VDD to provide up to 2.5 V−Vt. A smaller amount of current from VDD (than that provided by VDD) is needed to bring up VOUT to 3 V. The size of the capacitor (in FIG. 4, transistor 68) in the current management circuit is the controlling factor when VPP is used during the ramping up of the output voltage.

In a fourth example, VIN is 4 V, VDD is 2.5 V, VPP is 5 V, and VOUT is 4 V. In this case, a significant amount of current is drawn from VDD to provide up to 2.5 V−Vt. A large amount of current from VPP is needed to bring up VOUT to 4 V. Referring to FIG. 4, the size ratio of transistors 66 and 70 determines the maximum current drawn from VPP.

The foregoing specification has described specific exemplary embodiments. It will, however, be evident to a skilled artisan that various modifications and changes can be made to these embodiments without departing from the broader spirit and scope as set forth in the appended claims. For example, skilled artisans will appreciate that although the unity gain voltage buffer circuit has been described in exemplary embodiments in terms of specific circuitry and voltage levels, equivalent or similar circuits and voltages may be implemented. The specification and drawings are, accordingly, to be regarded in an illustrative rather than a restrictive sense.

What is claimed is:

1. A circuit comprising:
    an amplifier stage configured to amplify a difference between an input voltage and a feedback voltage;
    an output stage configured to produce an output voltage equal to the input voltage, the output stage configured to be driven by the difference between the input voltage and the feedback voltage, the output stage comprising:
    a main supply current path configured to provide a first current from a main supply source, the first current providing at least a portion of the output voltage; and a current management circuit configured to provide a second current from an auxiliary supply source, the second current providing any remaining portion of the output voltage not provided by the first current, wherein an auxiliary supply voltage provided at the auxiliary supply source is different from a main supply voltage provided at the main supply source, wherein the output voltage is greater than the main supply voltage when the input voltage is greater than the main supply voltage.

2. The circuit of claim 1 wherein the second current is a specified maximum current.

3. The circuit of claim 1 wherein the current management circuit is configured to limit the second current.

4. The circuit of claim 3 wherein the current management circuit includes a plurality of PMOS transistors.

5. The circuit of claim 4 wherein at least two of the plurality of PMOS transistors are configured to mirror onto a first node coupled to the output voltage a multiplicative factor of a third current at a second node, such that the second current is dependent on the third current.

6. The circuit of claim 5 wherein the multiplicative factor is determined by a size ratio between the at least two PMOS transistors.

7. A circuit comprising:
an amplifier stage configured to amplify a difference between an input voltage and a feedback voltage;
an output stage configured to produce an output voltage equal to the input voltage, the output stage configured to be driven by the difference between the input voltage and the feedback voltage, the output stage comprising:
a main supply current path configured to provide a first current from a main supply source, the first current providing at least a portion of the output voltage, wherein the main supply current path includes a plurality of NMOS transistors; and
a current management circuit configured to provide a second current from an auxiliary supply source, the second current providing any remaining portion of the output voltage not provided by the first current.

8. The circuit of claim 7 wherein at least one of the plurality of NMOS transistors is configured as a diode.

9. A circuit comprising:
an amplifier stage configured to amplify a difference between an input voltage and a feedback voltage;
an output stage configured to produce an output voltage equal to the input voltage, the output stage configured to be driven by the difference between the input voltage and the feedback voltage, the output stage comprising:
a main supply current path configured to provide a first current from a main supply source, the first current providing at least a portion of the output voltage; and
a current management circuit configured to provide a second current from an auxiliary supply source, the second current providing any remaining portion of the output voltage not provided by the first current, wherein the current management circuit comprises a device acting as a capacitor.

10. The circuit of claim 9 wherein the device is a PMOS transistor.

11. A method for producing an output voltage replicating an input voltage, the method comprising:
amplifying a difference between the input voltage and a feedback voltage;
providing a first current from a main supply source, the first current providing at least a portion of the output voltage; and
providing a second current from an auxiliary supply source, the second current providing any remaining portion of the output voltage not provided by the first current, the provision of the first and second currents driven by the difference between the input voltage and the feedback voltage, wherein an auxiliary supply voltage provided at the auxiliary supply source is different from a main supply voltage provided at the main supply source, wherein the output voltage is greater than the main supply source voltage when the input voltage is greater than the main supply voltage.

12. The method of claim 11 further comprising limiting the second current provided by the auxiliary supply source.

13. A method for producing an output voltage replicating an input voltage, the method comprising:
amplifying a difference between the input voltage and a feedback voltage;
providing a first current from a main supply source, the first current providing at least a portion of the output voltage;
providing a second current from an auxiliary supply source, the second current providing any remaining portion of the output voltage not provided by the first current, the provision of the first and second currents driven by the difference between the input voltage and the feedback voltage, wherein an auxiliary supply voltage provided at the auxiliary supply source is different from a main supply voltage provided at the main supply source; and
mirroring onto a first node coupled to the output voltage a multiplicative factor of a current through a second node coupled to a reference source, such that the second current is dependent on the current through the second node.

14. The method of claim 13 further comprising providing a sloped profile for current allowed through the first node.

15. A circuit comprising:
an amplifier stage configured to amplify a difference between an input voltage and a feedback voltage; and
an output stage configured to produce an output voltage equal to the input voltage, the output stage configured to be driven by the difference between the input voltage and the feedback voltage, the output stage comprising:
a current path configured to provide a first current from a main supply source, the first current supplying at least a portion of the output voltage; and
a current management circuit configured to provide a specified maximum current from an auxiliary supply source, the specified maximum current providing any remaining portion of the output voltage not provided by the current path, wherein an auxiliary supply voltage provided at the auxiliary supply source is different from a main supply voltage provided at the main supply source, wherein the output voltage is greater than the main supply voltage provided by the main supply source when the input voltage is greater than the main supply voltage.

16. A circuit comprising:
an amplifier stage configured to amplify a difference between an input voltage and a feedback voltage; and
an output stage configured to produce an output voltage equal to the input voltage, the output stage configured to be driven by the difference between the input voltage and the feedback voltage, the output stage comprising:
a current path configured to provide a first current from a main supply source, the first current supplying at least a portion of the output voltage; and a current management circuit configured to provide a specified maximum current from an auxiliary supply source, the specified maximum current providing any remaining portion of the output voltage not provided by the current path, wherein an auxiliary supply voltage provided at the auxiliary supply source is different from a main supply voltage provided at the main supply source, wherein the current path includes a plurality of NMOS transistors.

17. The circuit of claim 16 wherein at least one of the plurality of NMOS transistors is configured as a diode.

18. A circuit comprising:

an amplifier stage configured to amplify a difference between an input voltage and a feedback voltage; and an output stage configured to produce an output voltage equal to the input voltage, the output stage configured to be driven by the difference between the input voltage and the feedback voltage, the output stage comprising:

a current path configured to provide a first current from a main supply source, the first current supplying at least a portion of the output voltage; and a current management circuit configured to provide a specified maximum current from an auxiliary supply source, the specified maximum current providing any remaining portion of the output voltage not provided by the current path, wherein an auxiliary supply voltage provided at the auxiliary supply source is different from a main supply voltage provided at the main supply source, wherein the current management circuit includes a plurality of PMOS transistors.

19. The circuit of claim 18 wherein at least two of the plurality of PMOS transistors are configured to mirror onto a first node coupled to the output voltage a multiplicative factor of a third current at a second node, such that the specified maximum current is dependent on the third current.

20. The circuit of claim 19 wherein the multiplicative factor is determined by a size ratio between the at least two PMOS transistors.

21. A circuit comprising:

an amplifier stage configured to amplify a difference between an input voltage and a feedback voltage;

an output stage configured to produce an output voltage equal to the input voltage, the output stage configured to be driven by the difference between the input voltage and the feedback voltage, the output stage comprising:

a current path configured to provide a first current from a main supply source, the first current supplying at least a portion of the output voltage; and a current management circuit configured to provide a specified maximum current from an auxiliary supply source, the specified maximum current providing any remaining portion of the output voltage not provided by the current path, wherein the current management circuit comprises a device acting as a capacitor.

22. The circuit of claim 21 wherein the device is a PMOS transistor.

* * * * *

UNITED STATES PATENT AND TRADEMARK OFFICE
CERTIFICATE OF CORRECTION

| | | |
|---|---|---|
| PATENT NO. | : 7,656,219 B2 | Page 1 of 1 |
| APPLICATION NO. | : 11/627695 | |
| DATED | : February 2, 2010 | |
| INVENTOR(S) | : Victor Nguyen | |

It is certified that error appears in the above-identified patent and that said Letters Patent is hereby corrected as shown below:

In column 1, line 48, delete "may" and insert -- many --, therefor.

In column 1, line 59, delete "24" and insert -- 42 --, therefor.

In column 2, line 43, after "current" delete "supply" and insert -- supplying --, therefor.

In column 4, line 34, delete "VDD" and insert -- VPP --, therefor.

Signed and Sealed this

Twenty-third Day of November, 2010

David J. Kappos
*Director of the United States Patent and Trademark Office*

UNITED STATES PATENT AND TRADEMARK OFFICE
CERTIFICATE OF CORRECTION

PATENT NO. : 7,656,219 B2  Page 1 of 1
APPLICATION NO. : 11/627695
DATED : February 2, 2010
INVENTOR(S) : Victor Nguyen It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 196 days.

Signed and Sealed this

Twenty-eighth Day of December, 2010

David J. Kappos
*Director of the United States Patent and Trademark Office*